United States Patent
Ando et al.

(10) Patent No.: US 6,747,356 B2
(45) Date of Patent: Jun. 8, 2004

(54) SEMICONDUCTOR DEVICE

(75) Inventors: Hideko Ando, Ome (JP); Seiji Miyamoto, Tachikawa (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/386,441

(22) Filed: Mar. 13, 2003

(65) Prior Publication Data

US 2003/0173640 A1 Sep. 18, 2003

(30) Foreign Application Priority Data

Mar. 15, 2002 (JP) ........................................ 2002-073159

(51) Int. Cl.[7] .............................................. H01L 23/48
(52) U.S. Cl. ...................... 257/758; 257/691; 257/698; 257/737; 257/738; 257/748; 257/758; 257/772; 257/773; 257/774; 257/775; 257/779; 257/780; 257/781; 438/118; 438/622; 361/760; 361/761; 361/762; 361/763; 361/764; 361/772; 361/773; 361/774; 174/255; 174/256; 174/257; 174/258; 174/259; 174/260; 174/261; 174/262
(58) Field of Search .................... 257/691, 698, 257/737, 738, 748, 758, 772, 773, 774, 775, 779, 780, 781; 361/760–764, 772–774; 438/118, 622; 174/255–262

(56) References Cited

U.S. PATENT DOCUMENTS

| | | | |
|---|---|---|---|
| 4,464,704 A | * 8/1984 | Huie et al. | 361/792 |
| 4,931,354 A | * 6/1990 | Wakino et al. | 428/209 |
| 5,347,403 A | * 9/1994 | Uekusa | 360/3 |
| 6,376,052 B1 | * 4/2002 | Asai et al. | 428/209 |
| 6,534,723 B1 | * 3/2003 | Asai et al. | 174/255 |

FOREIGN PATENT DOCUMENTS

JP 2001-77541 9/1999

* cited by examiner

Primary Examiner—Allan R. Wilson
Assistant Examiner—Edgardo Ortiz
(74) Attorney, Agent, or Firm—Reed Smith LLP; Stanley P. Fisher, Esq.; Juan Carlos A. Marquez, Esq.

(57) ABSTRACT

Control of the characteristic impedance of wirings is performed with high accuracy. Relative to a first wiring of a second wiring layer arranged above a through hole of a core layer in a package board, the thickness of a first insulating layer between a first wiring layer on the surface of the core layer and the second wiring layer is made large, and the thickness of a second insulating layer between a third wiring layer that is a plane layer on the side of opposite thereto and the second wiring layer is made small, thereby allowing for: reducing the impedance coupling between the power plane of the first wiring layer on the surface of the core layer and the first and second wirings; reinforcing the impedance coupling between the power plane of the third wiring layer on the side opposite thereto and the first and second wirings; and achieving the reduction of the difference in the characteristic impedance between the first wiring arranged just above the through hole and the second wiring arranged away from just above the through hole.

11 Claims, 13 Drawing Sheets

SEMICONDUCTOR DEVICE

BACKGROUND OF THE INVENTION

The present invention relates to a semiconductor device and, more particularly, to a technique effectively applied to the improvement of electric properties of a semiconductor device in which a multilayer circuit board is used.

There is, for example, a FC-BGA (Flip Chip-Ball Grid Array) as a chip for high-speed and multi-pin semiconductor. As a substrate for this package, a ceramic substrate and an organic substrate, etc. are used. The organic substrate is, however, more efficient in terms of the cost reduction. In order to deal with the multi-pin semiconductor chip, a build-up process, in which micro wirings are formed by the photolithography on the front and rear of a core layer having through holes formed by a drill, has recently been employed in the organic substrate.

In such a package for high-speed and multi-pin semiconductor chip, there are required good electric properties and, for example, is need for reducing a variation in the characteristic impedance values of all signal wirings in the package.

Note that a technique for solving noise problems without changing the characteristic impedance of the multilayer circuit board (wiring board) is disclosed in Japanese Patent Laid-open No. 2001-77541. The above technique is one for separating the signal wirings from a ground conductor layer in order to adjust the impedance relative to the ground conductor layer.

SUMMARY OF THE INVENTION

Meanwhile, Japanese Patent Laid-Open No. 2001-77541 discloses that the characteristic impedance changes depending on the thickness of an insulating layer arranged between the ground conductor layer and the signal wiring. However, it does not have any descriptions of the influence of the characteristic impedance, which is exerted on the signal wirings from a plurality of through-hole wirings formed on a core layer, the signal wirings being formed just above it via an insulating layer, in the case where a package board is, for example, a build-up board.

More specifically, in the actual package board, the plurality of through-hole wirings are formed in the core layer, and a large number of signal wirings are arranged also on the through-hole wirings via the insulating layer. Therefore, it is difficult to achieve the arrangement in which no signal wirings are formed above the through-hole wirings.

Accordingly, it is insufficient in the design of the package board to consider simply the change in the characteristic impedance depending on the thickness of the insulating layer arranged between the ground conductor layer and the signal wiring. Thereby, the problem occurs such that variation in impedances of the signal wirings on the through-hole wirings and the signal wirings on no through-hole wirings is beyond control.

An object of the present invention is to provide a semiconductor device capable of reducing the variation in the characteristic impedance of the wirings with high accuracy.

The above and other objects and novel characteristics of the present invention will be apparent from the description of this specification and the accompanying drawings.

The typical ones of the inventions disclosed in this application will be briefly described as follows.

That is, the present invention comprises: a multilayer circuit board having an insulating base member, a first wiring layer arranged on a surface of the base member and provided with a power plane, a third wiring layer arranged on said first wiring layer via an insulating layer in a direction further away from said base member and provided with a power plane, and a second wiring layer arranged between said first and third wiring layers and provided with a signal wiring; and a semiconductor chip arranged on a main surface of said multilayer circuit board, wherein the gap between said first and second wiring layers is larger than that between said second and third wiring layers, and an area of the power plane of said third wiring layer is larger than that of the power plane of said first wiring layer.

DESCRIPTION OF THE PREFERRED EMBODIMENTS

Hereinafter, embodiments of the present invention will be described based on the drawings.

The following embodiments will be divided into a plurality of sections or other embodiments and be described when required as a matter of convenience. However, these sections or other embodiments are not irrelevant to each other unless otherwise stated, and one of them relates to a part or the entire of the other as a modification example, details, a supplementary explanation thereof, or the like.

Also, in the following embodiments, when the number of elements or the like (including number of pieces, values, amount, range, or the like) is mentioned, it is not limited to a specific number unless otherwise stated or except the case where the number is apparently limited to a specific number in principle, and may be the number larger or smaller than the specific number.

Furthermore, needless to say, components (including element steps or the like) mentioned in the following embodiments are not always indispensable unless otherwise stated and except the case where it is understood that they are apparently indispensable in principle.

Similarly, in the following embodiments, when the shapes of the components, the positional relation thereof, and the like are mentioned, ones substantially approximate and similar to the shapes or the like are included therein unless otherwise stated or except the case where it can be understood that they are apparently excluded in principle. This condition is also applicable to the numerical value and the range described above.

Also, components having the same function are denoted by the same reference symbols throughout the drawings for describing the embodiments, and the repetitive description thereof will be omitted.

(First Embodiment)

Figure 1:
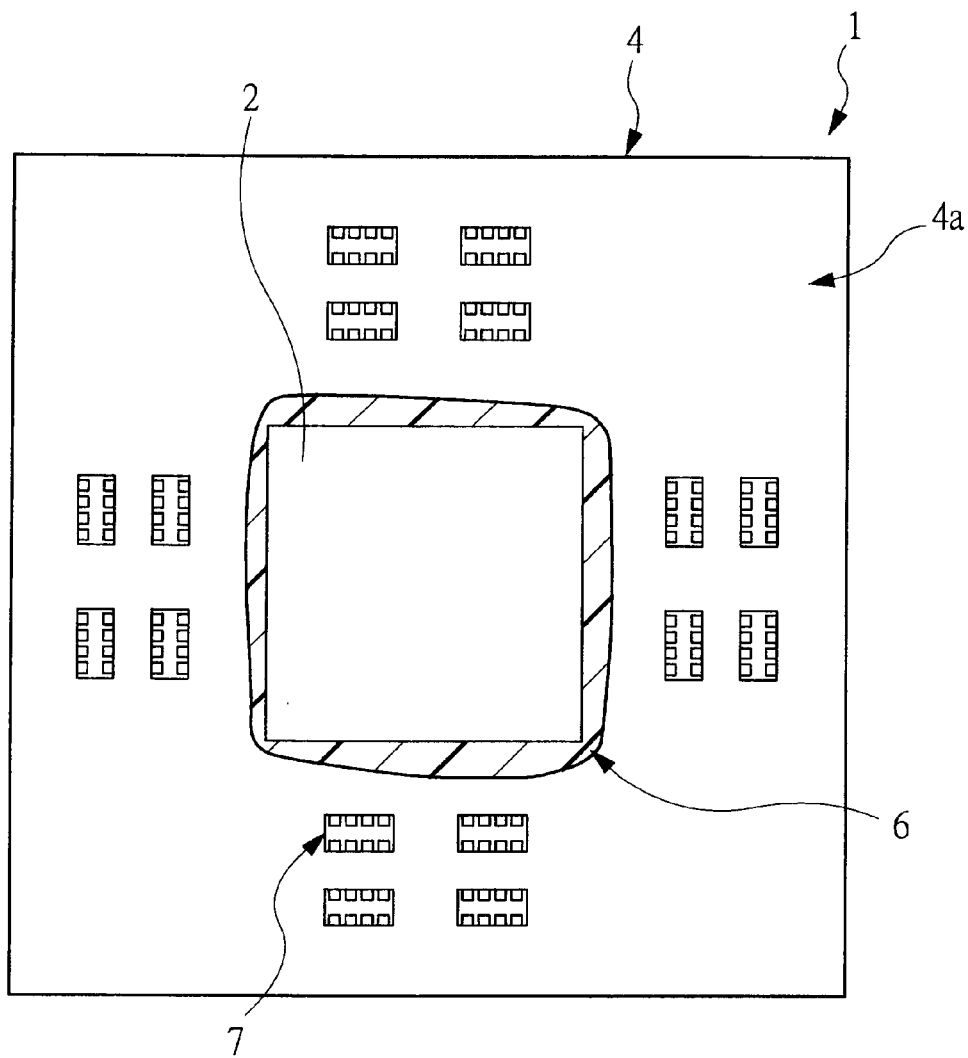
FIG. 1 is a plan view showing an example of a structure of a semiconductor device (BGA) according to a first embodiment of the present invention.
Figure 2:
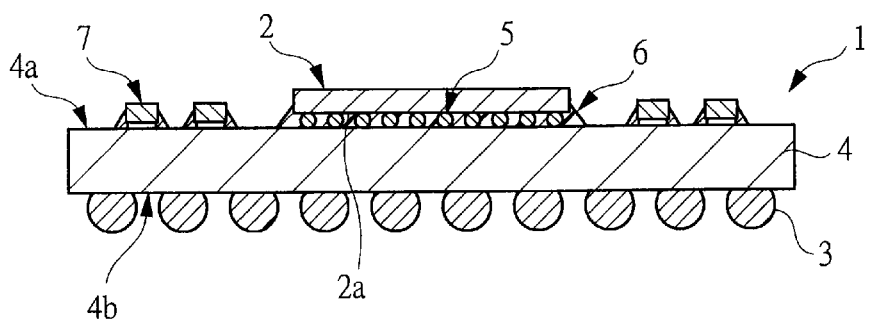
FIG. 2 is a cross-sectional view showing the structure of the BGA shown in FIG. 1.
Figure 3:
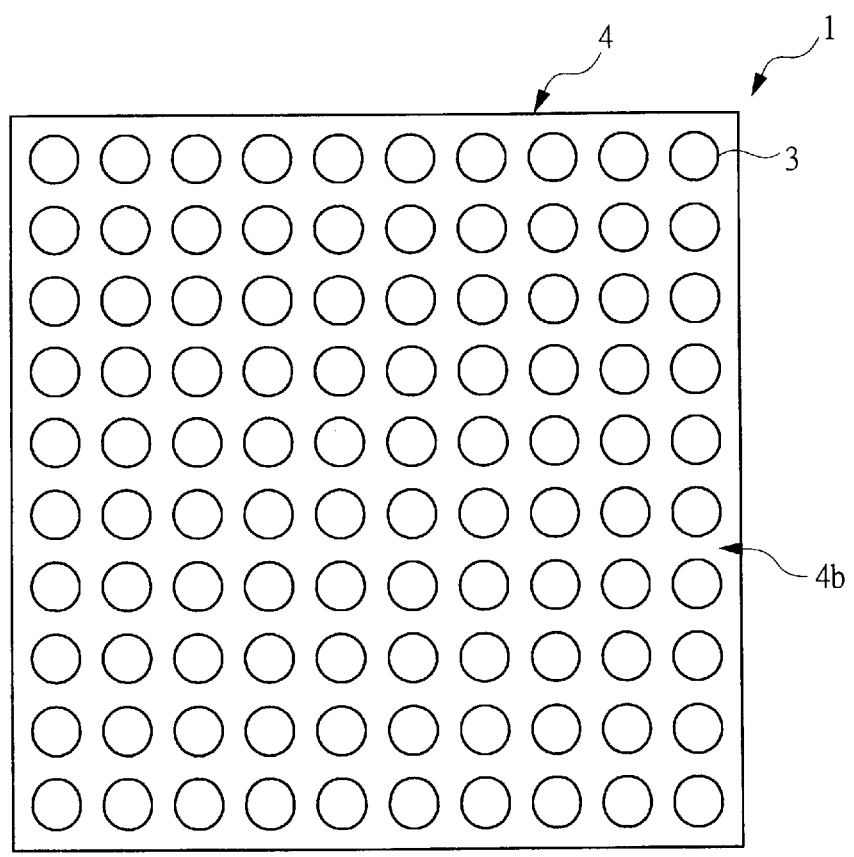
FIG. 3 is a bottom plan view showing the structure of the BGA shown in FIG. 1.
Figure 4:
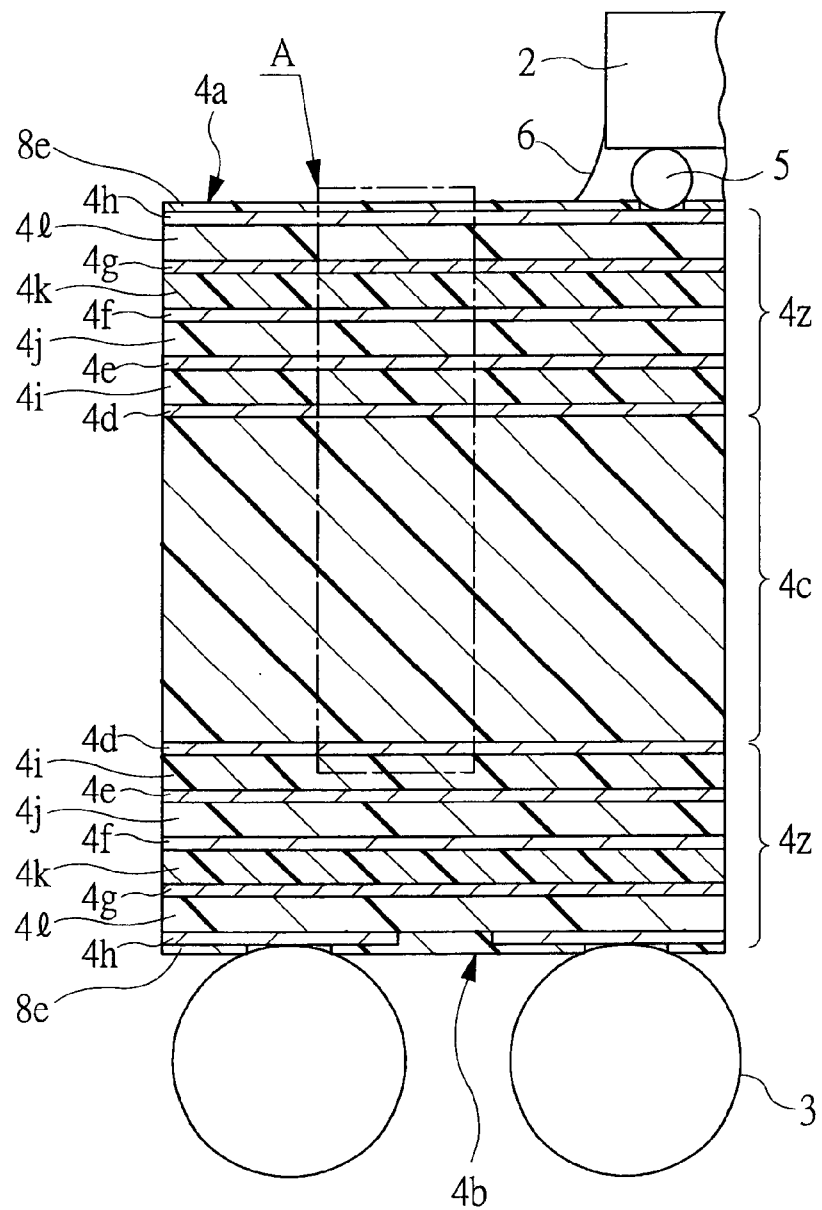
FIG. 4 is a partially enlarged sectional view showing an example of a structure of a multilayer circuit board incorporated in the BGA shown in FIG. 1.
Figure 5:
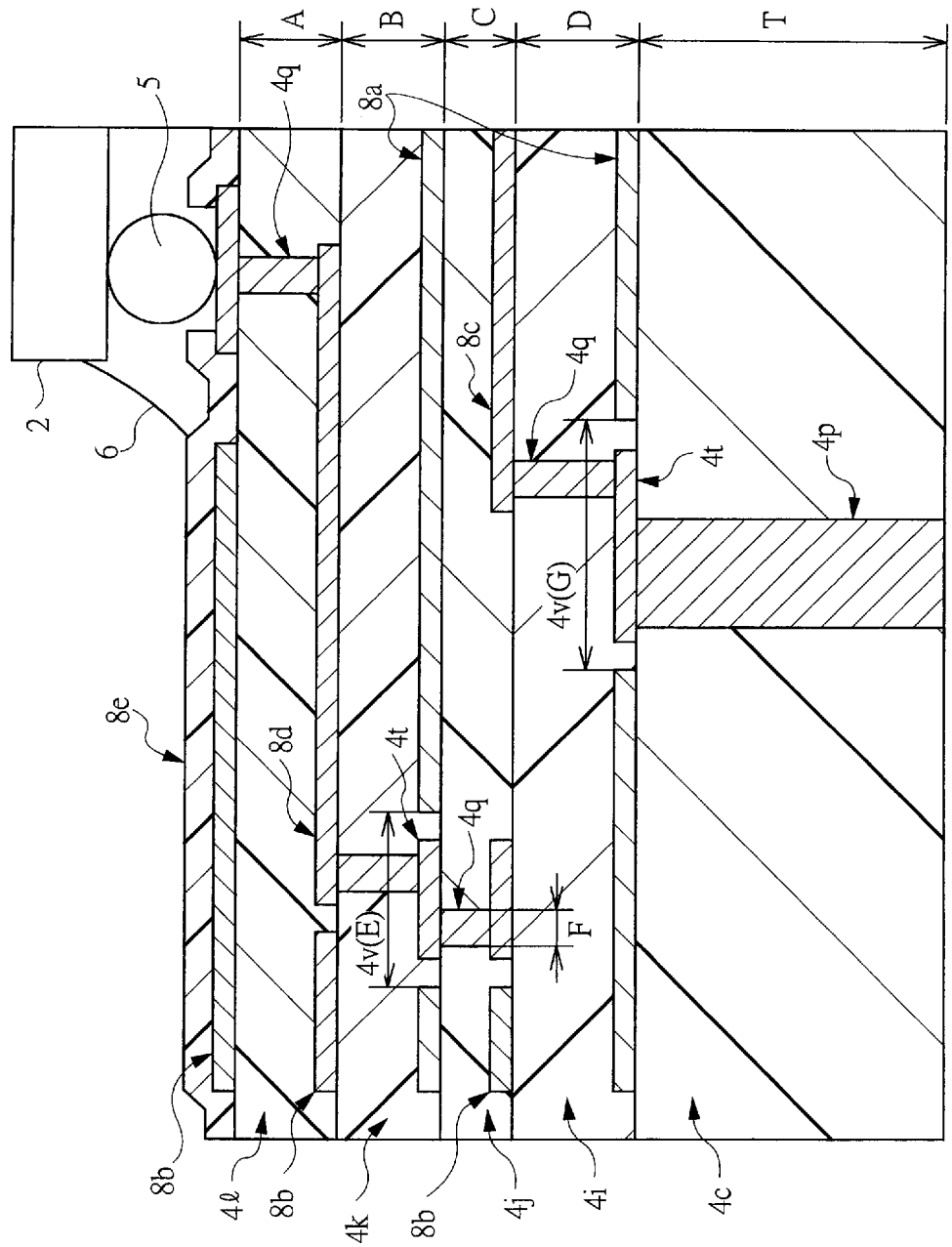
FIG. 5 is a partially enlarged sectional view showing a detailed structure of the region A shown in FIG. 4.
Figure 6:
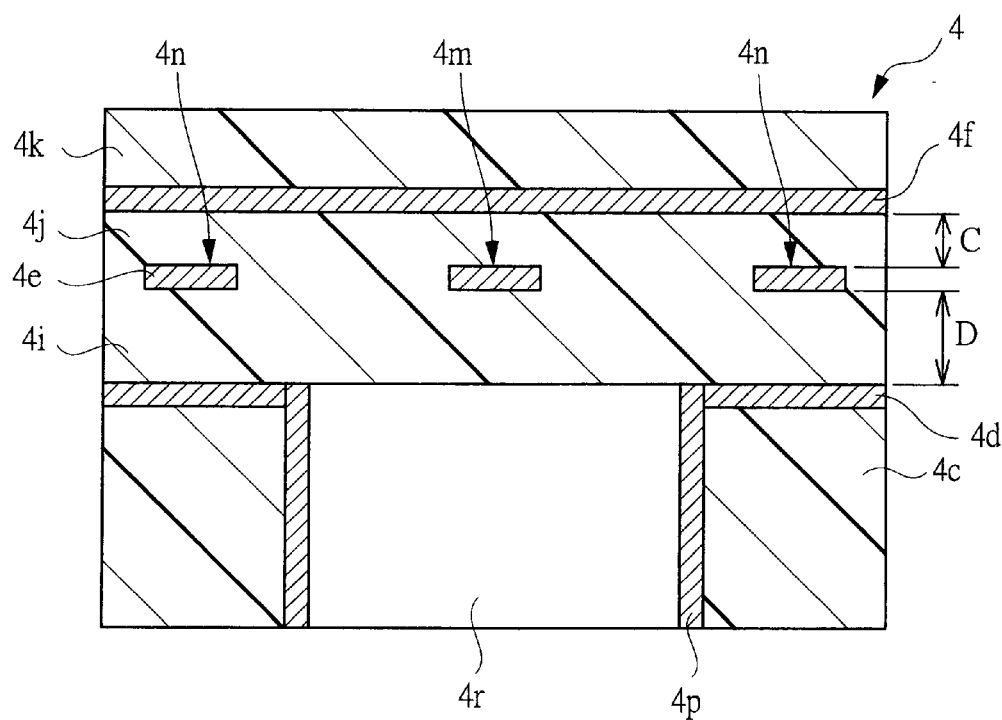
FIG. 6 is a partially enlarged sectional view showing an example of a positional relationship between the via wiring of a core layer and wirings just above the via wiring, in the board structure shown in FIG. 5.
Figure 7:
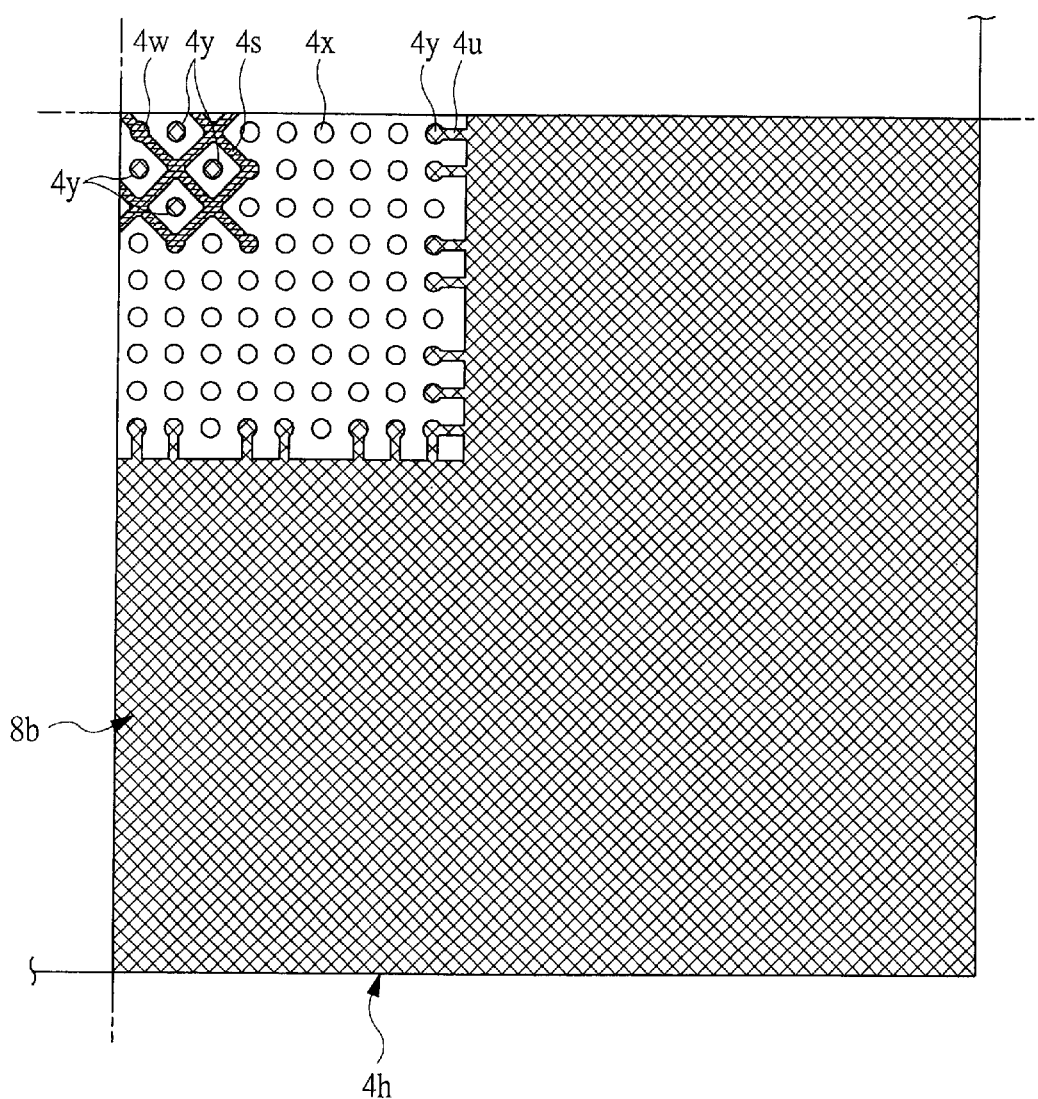
FIG. 7 is a partially enlarged plan view showing an example of a structure of a fifth wiring layer, in the board structure shown in FIG. 4.
Figure 8:
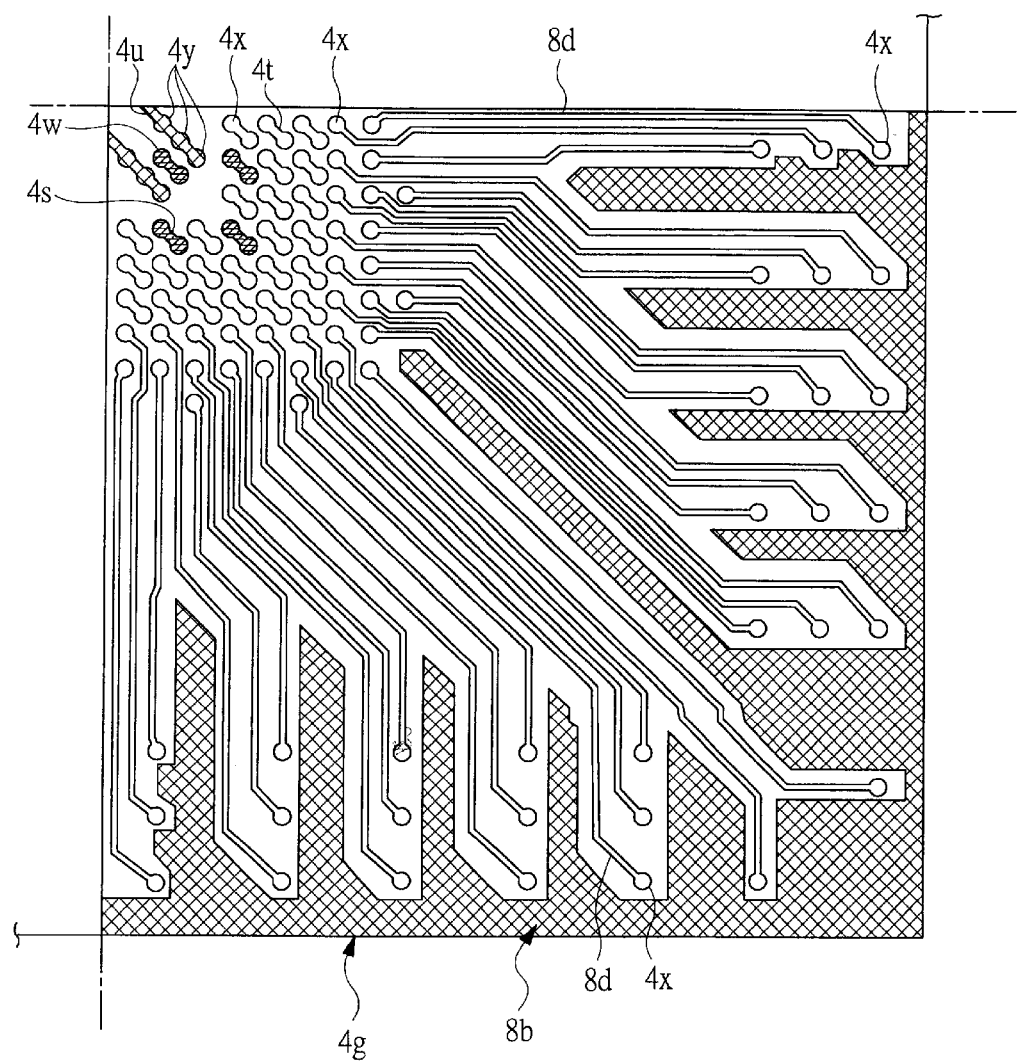
FIG. 8 is a partially enlarged plan view showing an example of a structure of a fourth wiring layer, in the board structure shown in FIG. 4.
Figure 9:
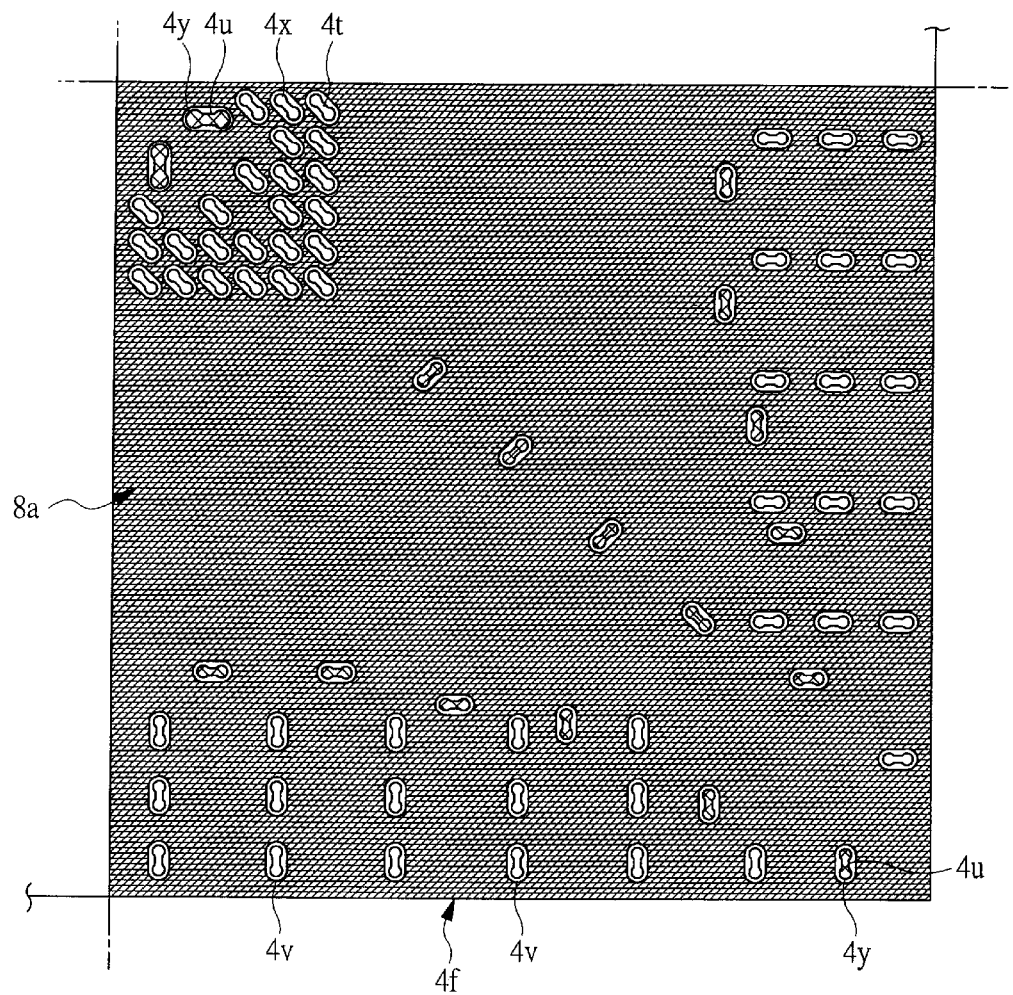
FIG. 9 is a partially enlarged plan view showing an example of a structure of a third wiring layer, in the board structure shown in FIG. 4.
Figure 10:
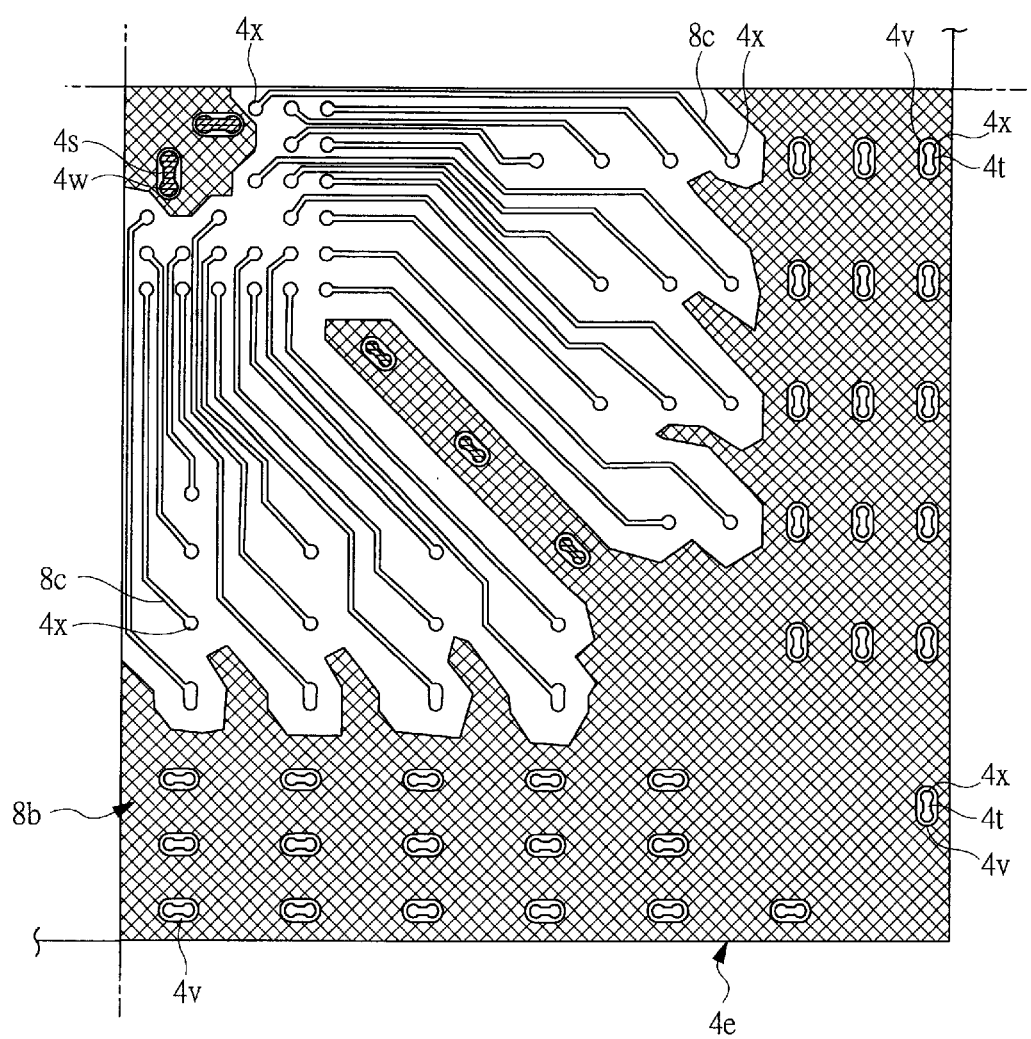
FIG. 10 is a partially enlarged plan view showing an example of a structure of a second wiring layer, in the board structure shown in FIG. 4.
Figure 11:
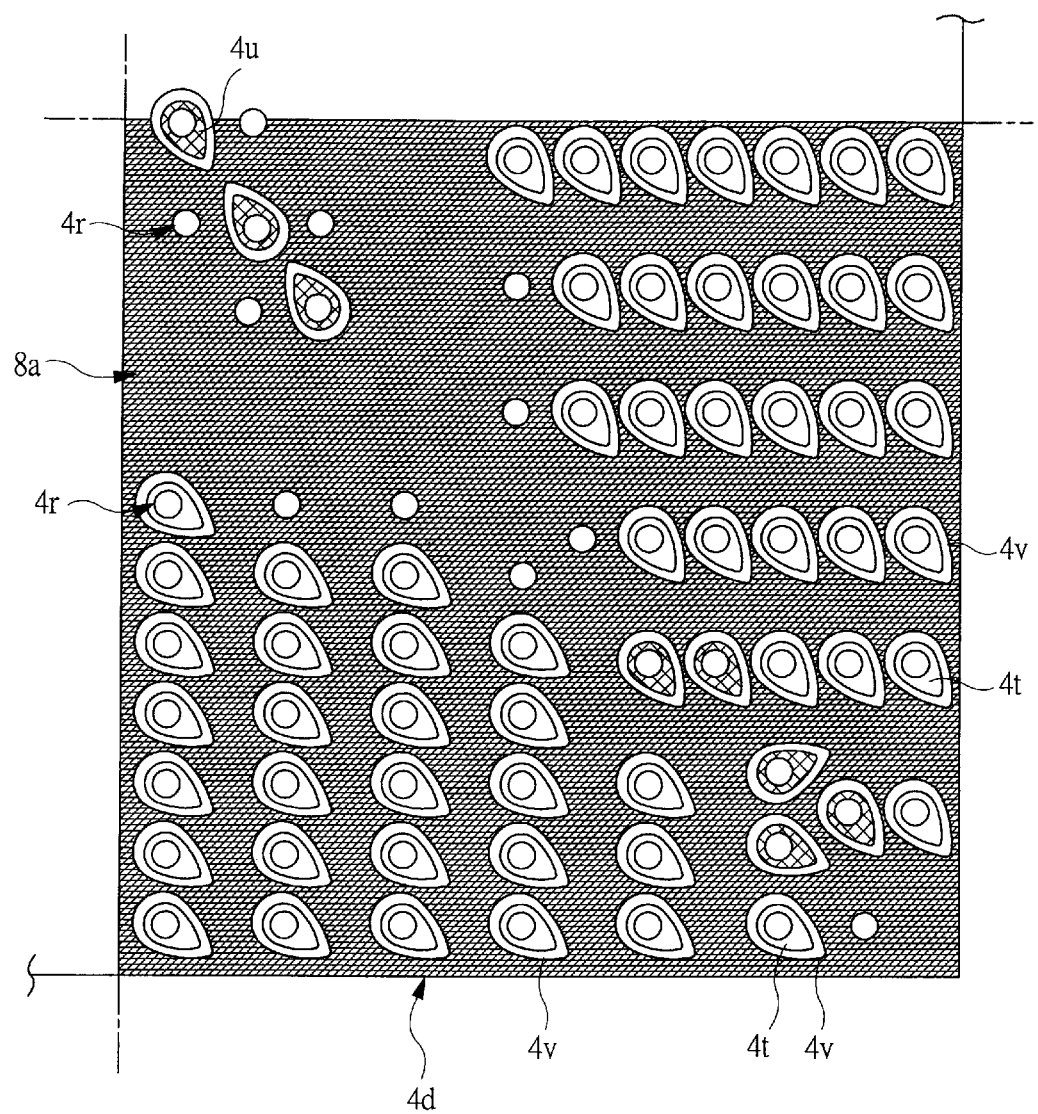
FIG. 11 is a partially enlarged plan view showing an example of a structure of a first wiring layer, in the board structure shown in FIG. 4.
Figure 12:
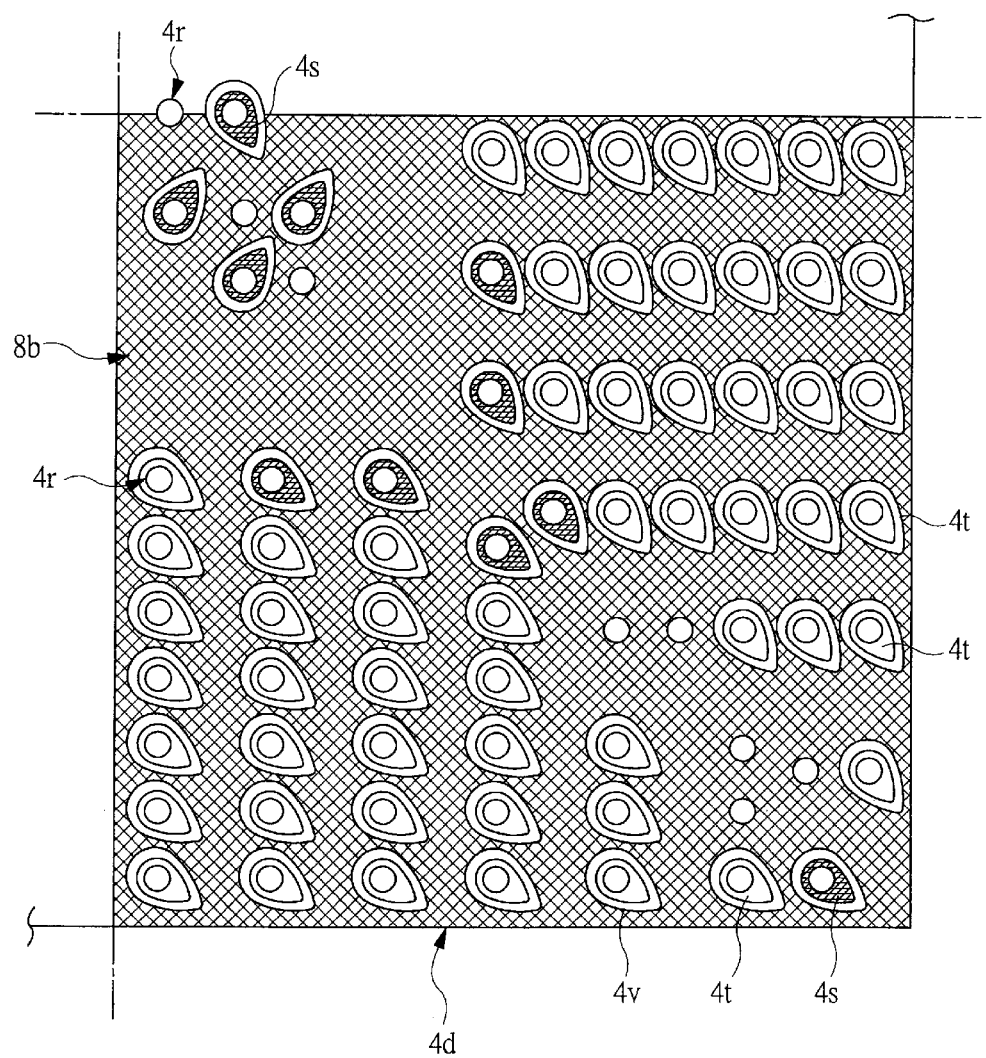
FIG. 12 is a partially enlarged plan view showing an example of a structure of a first wiring layer on the ball side, in the board structure shown in FIG. 4.
Figure 13:
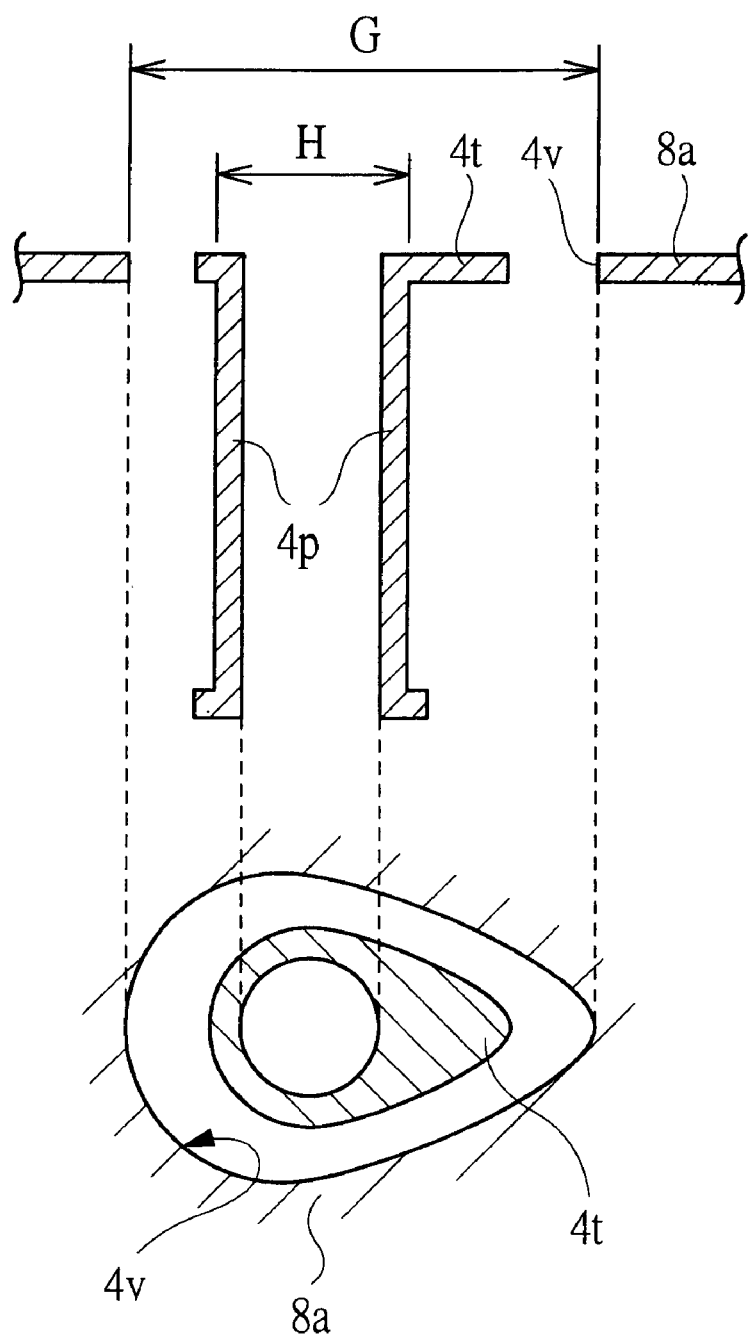
FIG. 13 is an enlarged sectional view and an enlarged plan view showing an example of the structure of the via wiring shown in FIG. 11.

FIG. 1 is a plan view showing an example of a structure of a semiconductor device (BGA) according to a first embodiment of the present invention; FIG. 2 is a cross-sectional view showing the structure of the BGA shown in FIG. 1; FIG. 3 is a bottom plan view showing the structure of the BGA shown in FIG. 1; FIG. 4 is a partially enlarged sectional view showing an example of a structure of a multilayer circuit board incorporated in the BGA shown in FIG. 1; FIG. 5 is a partially enlarged sectional view showing a detailed structure of the region A shown in FIG. 4; FIG. 6 is a partially enlarged sectional view showing an example of a positional relationship between the via wiring of a core layer and wirings just above the via wiring, in the board structure shown in FIG. 5; FIG. 7 is a partially enlarged plan view showing an example of a structure of a fifth wiring layer, in the board structure shown in FIG. 4; FIG. 8 is a partially enlarged plan view showing an example of a structure of a fourth wiring layer, in the board structure shown in FIG. 4; FIG. 9 is a partially enlarged plan view showing an example of a structure of a third wiring layer, in the board structure shown in FIG. 4; FIG. 10 is a partially enlarged plan view showing an example of a structure of a second wiring layer, in the board structure shown in FIG. 4; FIG. 11 is a partially enlarged plan view showing an example of a structure of a first wiring layer, in the board structure shown in FIG. 4; FIG. 12 is a partially enlarged plan view showing an example of a structure of a first wiring layer on the ball side, in the board structure shown in FIG. 4; and FIG. 13 is an enlarged sectional view and an enlarged plan view showing an example of the structure of the via wiring shown in FIG. 11.

Note that FIGS. 7 to 12 are drawings showing wiring patterns of each wiring layer in a package board 4. However, each of the drawings shows only a certain one-fourth area of the wiring layer-in the package board 4 shown in FIG. 1, and equivalent wiring patterns thereto are formed also on the remaining three-fourths area of the respective wiring layers.

A semiconductor device according to a first embodiment shown in FIGS. 1 to 3 is a multi-pin semiconductor package and is a BGA (Ball Grid Array) 1 in which: a semiconductor chip 2 is mounted by a flip-chip bonding on a main surface 4a of the package board 4 which is a multilayer circuit board; and a plurality of ball electrodes 3, which are external connection terminals, are arranged in an array on a rear surface 4b opposite to the main surface 4a of the package board 4 as shown in FIG. 3.

Note that the flip-chip bonding is performed via solder bump electrodes 5. More specifically, the main surface 2a of the semiconductor chip 2 and the main surface 4a of the package board 4 are faced to put therebetween the solder bump electrodes 5, and the semiconductor chip 2 and the package board 4 are electrically connected to each other via the solder bump electrodes 5. Furthermore, connection portions brought with the flip-chip bonding are protected by an underfill resin 6 formed of, for example, an insulating resin or the like.

Also, chip capacitors 7, which are chip parts, are mounted on the periphery of the semiconductor chip 2 and on the side of the main surface 4a of the package board 4.

Further, the ball electrodes 3, which are arranged on the side of the rear surface 4b of the package board 4, are formed of, for example, solder.

Also, as shown in FIG. 4, the package board 4 is a multilayer circuit board, and is a build-up board, in which wiring layers and insulating layers are laminated by a build-up process on both of the chip side and ball electrode (external connection terminal) side of a core layer 4c that is a base member.

Therefore, the build-up layer 4z composed of the wiring layers and the insulating layers is symmetrically formed on each of the chip side and the ball electrode side of the surfaces of the core layer 4c, whereby micro-wirings can be formed therein.

Note that the package board 4 of the BGA 1 according to the first embodiment exemplifies the case where the build-up layer 4z on one side has five wiring layers and four insulating layers each provided between the wiring layers.

More specifically, toward the semiconductor chip 2 and the ball electrodes 3 from the core layer 4c, a first wiring layer 4d, a second wiring layer 4e, a third wiring layer 4f, a fourth wiring layer 4g, and a fifth wiring layer 4h are respectively formed, and a first insulating layer 4i, a second insulating layer 4j, a third insulating layer 4k, and a fourth insulating layer 4l are formed between the respective wiring layers. Also, an insulating film 8e such as a resist film etc. is formed on the surface of the fifth wiring layer 4h.

In the package 4 as shown in FIG. 6, relative to a first wiring 4m of the second wiring layer 4e arranged above a through hole 4r of the core layer 4c, the thickness (D) of the first insulating layer 4i between the first wiring layer 4d that is a plane layer on the surface of the core layer 4c and the second wiring layer 4e is made large, and that of the second insulating layer 4j (C) between the third wiring layer 4f that is a plane layer on the opposite side thereto and the second wiring layer 4e is made small. Therefore, the BGA 1 according to the first embodiment reduces the impedance coupling between a power plane 8a, as shown in FIG. 11, of the first wiring layer 4d that is a plane layer on the surface of the core layer 4c and the first and second wirings 4m and 4n, and increases the impedance coupling between the power plane 8a, as shown in FIG. 9, of the third wiring layer 4f that is a plane layer on the opposite side thereto and the first and second wirings 4m and 4n.

Due to this, it becomes possible to control the characteristic impedance of the wirings with high accuracy, and to achieve the reduction of the difference in the characteristic impedance between the first wiring 4m arranged above the through hole 4r and the second wiring 4n arranged away from above the through hole 4r.

Next, the detailed structure of the build-up layer 4z of the package board 4 will be described. Note that the constitution of the core layer 4c and that of the build-up layer 4z on the chip side will be described here. However, the build-up layer 4z on the ball electrode side has almost the same structure.

First, as shown in FIG. 5, a plurality of first via wirings 4p, serving as first through-hole wirings that electrically connect the surface on the chip side and the surface on the ball electrode side, are provided in the core layer 4c.

More specifically, wirings shown in FIG. 11, which are provided on the first wiring layer 4d that is the surface of the core layer 4c on the chip side, and wirings shown in FIG. 12, which are provided on the first wiring layer 4d that is the surface corresponding thereto on the ball electrode side, are electrically connected to one another through the first via wiring 4p shown in FIG. 5.

For example, as shown in FIG. 11, the power plane 8a, that is, a conductor pattern for supplying electric power is formed in the first wiring layer 4d that is the surface of the core layer 4c on the chip side. Correspondingly, power wirings 4s, each having the shape combining a half circle and a triangle as shown in FIG. 12, are formed in the first wiring layer 4d that is the surface of the core layer 4c on the ball electrode side. The power plane 8a of the first wiring layer 4d on the chip side and the power wirings 4s of the first wiring layer 4d on the ball electrode side are electrically connected to each other via the first via wiring 4p.

Similarly, a ground plane 8b, that is, a ground conductor pattern is formed in the first wiring layer 4d on the ball electrode side. Correspondingly, ground wirings 4u, each having the shape combining a half circle and a triangle, are formed in the first wiring layer 4d on the chip side.

Note that each power wiring is one for supplying a predetermined electric power, and the ground wiring is one for supplying electric power having a reference potential such as 0 V etc. Therefore, the ground plane 8b can be regarded as a kind of the power plane 8a.

Also, a plurality of signal wirings 4t, each having the shape combining a half circle and a triangle, are formed in each first wiring layer 4d on the chip side and the ball electrode side. The signal wirings 4t on the chip side and the signal wirings 4t on the ball electrode side are electrically connected to each other via the first via wiring 4p.

Therefore, each wiring escape 4v, which avoids being electrically connected to the power wiring 4s, the ground wiring 4u, and the signal wiring 4t that have the shape combining a half circle and a triangle, is formed in the power plane 8a and the ground plane 8b of the first wiring layers 4d on the chip side and the ball electrode side.

Furthermore, since the plurality of through holes 4r are also formed, a large number of wiring escapes 4v are formed in the power plane 8a and the ground plane 8b, whereby a region, in which respective conductive portions are not formed, is widely extended therein. Therefore, the respective areas of conductive portions in the power plane 8a of the first wiring layer 4d on the chip side and in the ground plane 8b of the first wiring layer 4d on the ball electrode side are extremely smaller in comparison to the area of the power plane 8a of the third wiring layer 4f of the package board 4.

Next, the structure of the second wiring layer 4e in the build-up layer 4z on the chip side of the core layer 4c will be described with reference to FIG. 10.

A plurality of first signal wirings 8c are formed in the second wiring layer 4e shown in FIG. 10, and the wirings are led from a signal terminal 4x within a region located below the chip, to a signal terminal 4x within a region located outside the chip.

Also, other signal wirings 4t for connecting the upper second via wiring 4q and the lower second via wiring 4q, and the wiring escapes 4v for avoiding these are arranged on the periphery of the plurality of first signal wirings 8c, whereby the ground plane 8b that is a plane-tight wiring is formed on the periphery thereof.

More specifically, in the second wiring layer 4e, the plurality of first signal wirings 8c are surrounded by the ground plane 8b.

Next, the structure of the third wiring layer 4f in the build-up layer 4z on the chip side of the core layer 4c will be described with reference to FIG. 9.

In the third wiring layer 4f shown in FIG. 9, the power plane 8a that is a plane-tight wiring is formed.

Furthermore, the plurality of signal wirings 4t and ground wirings 4u for connecting the upper second via wiring 4q and the lower second via wiring 4q are formed, respectively, and the power plane 8a, in which the wiring escapes 4v for avoiding these are formed, is formed.

Note that the signal wirings 4t and the ground wirings 4u of the third wiring layer 4f are wirings having an extremely small area, so that the power plane 8a of the third wiring layer 4f, which is arranged to avoid these, becomes plane with an area much larger than the power plane 8a of the first wiring layer 4d.

Next, the structure of the fourth wiring layer 4g in the build-up layer 4z on the chip side of the core layer 4c will be described with reference to FIG. 8.

In the fourth wiring layer 4g shown in FIG. 8, a plurality of second signal wirings 8d are formed, and, similarly to the first signal wirings 8c of the second wiring layer 4e, wirings are led from the signal terminal 4x within a region located below the chip, to the signal terminal 4x within a region located outside the chip.

Also, the ground plane 8b is formed on the periphery of the plurality of second signal wirings 8d so as to avoid these. Accordingly, also in the fourth wiring layer 4g, the plurality of second signal wirings 8d are surrounded by the ground plane 8b.

Next, the structure of the fifth wiring layer 4h that is the uppermost plane layer in the build-up layer 4z on the chip side of the core layer 4c will be described with reference to FIG. 7.

In the fifth wiring layer 4h shown in FIG. 7, a plurality of signal terminals 4x, power terminals 4w and ground terminals 4y for the flip-chip bonding are formed at the positions, which correspond to the arrangement of the solder bump electrodes 5 mounted on the main surface 2a of the semiconductor chip 2, and the ground plane 8b is formed on the outside thereof.

Furthermore, the power terminals 4w are electrically connected to each other via the power wiring 4s, and ground terminals 4y are electrically connected to the ground plane 8b outside them via the ground wiring 4u.

Therefore, the plurality of signal terminals 4x are surrounded by the ground plane 8b in the fifth wiring layer 4h, whereby terminals and wirings of the signal system are respectively surrounded by the ground plane 8b in the second wiring layer 4e, the fourth wiring layer 4g, and the fifth wiring layer 4h in which the plurality of signal terminals 4x, first signal wirings 8c and second signal wirings 8d are formed.

Additionally, the first signal wiring 8c of the second wiring layer 4e is sandwiched between the power plane 8a of the first wiring layer 4d and the power plane 8a of the third wiring layer 4f. Also, the second signal wiring 8d of the fourth wiring layer 4g is sandwiched between the power plane 8a of the third wiring layer 4f and the ground plane 8b of the fifth wiring layer 4h.

Therefore, each of the terminals and wirings of the signal system in addition to the tops and bottoms of them is covered with the power plane 8a and the ground plane 8b. For this reason, a board structure is obtained which is capable of preventing the occurrence of noises on the terminals and the wirings of the signal system, or the deterioration in frequency characteristics, or the like.

Also, the signal terminals 4x of the fifth wiring layer 4h and the signal terminals 4x of the fourth wiring layer 4g corresponding thereto, and the signal terminals 4x of the second wiring layer 4e and the signal terminals 4x of the fourth wiring layer 4g corresponding thereto are electrically connected, as shown in FIG. 5, via the second via wirings 4q that are second through-hole wirings.

Note that, with respect to the first via wiring 4p and the second via wiring 4q, the diameter of the first via wiring 4p is much larger than that of the second via wiring 4q. For example, when the thickness (T) of the core layer 4c is about 800 µm, the wiring diameter (H) equivalent to the via diameter of the first via wiring 4p is, for example, 250 to 300 µm as shown in FIG. 13. However, the wiring diameter (F) equivalent to the via diameter of the second via wiring 4q is, for example, 100 µm or smaller as shown in FIG. 5.

This causes a difference between the hole diameters of the above-mentioned through holes because the methods of processing the underlying through hole are different depending on each thickness of the layers.

More specifically, since the thickness (T) of the core layer 4c is about 800 µm, the underlying through hole is formed using a drill. At this time, if the drill having a small diameter is used, it may be broken. Therefore, a drill having a relatively large diameter is used.

In contrast, since the underlying through hole of the second via wiring 4q has a thickness of several tens µm, it is formed by a lithography technique or a laser process.

Therefore, the above-mentioned underlying through hole, having a diameter much smaller than the underlying through hole of the first via wiring 4p, can be formed.

As a result, also with respect to the wiring escape 4v, the size (E) of the wiring escape 4v is equivalent to a width of about 400 µm in the case of the second via wiring 4q shown in FIG. 5. In contrast, the size (G) of the wiring escape 4v is equivalent to a diameter of about 800 to about 900 µm in the case of the first via wiring 4p as shown in FIG. 13. That is, the wiring escape 4v formed in the first wiring layer 4d shown in FIG. 11 is much larger than the wiring escape 4v formed in the third wiring layer 4f shown in FIG. 9.

Also, since the diameter (G) of the wiring escape 4v, as shown in FIG. 13, of the first via wiring 4p formed in the core layer 4c is about 800 to about 900 µm, it is much larger than any of the thicknesses of the first insulating layer 4i, the second insulating layer 4j, the third insulating layer 4k, and the fourth insulating layer 4l (e.g., about 30 to about 50 µm).

In the BGA 1 thus employing the package board 4 as described above, as shown in FIG. 6, there often occurs the case where the first wiring 4m is arranged just above the through hole 4r and the wiring escape 4v, in the upper second wiring layer 4e on the first wiring layer 4d on the surface of the core layer 4c.

More specifically, the plurality of through holes 4r and wiring escapes 4v larger in size than the wiring escapes 4v formed in the third wiring layer 4f as shown in FIG. 9 are formed in the first wiring layer 4d on the surface of the core layer 4c as shown in FIG. 11. Accordingly, in the first signal wiring 8c (the first wiring 4m and the second wiring 4n shown in FIG. 6) of the second wiring layer 4e as shown in FIG. 10, it becomes difficult to arrange all of the first signal wirings 8c away from above the through holes 4r and the wiring escapes 4v of the first wiring layer 4d. As a result, signal wirings such as the first wirings 4m are inevitably arranged just above the through holes 4r and the wiring escapes 4v as shown in FIG. 6.

In contrast, in the second signal wirings 8d in the fourth wiring layer 4g shown as shown in FIG. 8, the size of each wiring escape 4v of the lower third wiring layer 4f as shown in FIG. 9 is sufficiently smaller than each wiring escape 4v in the first wiring layer 4d. Therefore, the respective second signal wirings 8d in the fourth wiring layer 4g can be formed at positions away from the wiring escapes 4v of the third wiring layer 4f.

Consequently, in the package board 4 of the BGA 1 according to the first embodiment as shown in FIG. 6, relative to the first wiring 4m of the second wiring layer 4e arranged above the through hole 4r of the core layer 4c, the thickness (D) of the first insulating layer 4i between the first wiring layer 4d that is a plane layer on the surface of the core layer 4c and the second wiring layer 4e is made large, and the thickness (C) of the second insulating layer 4j between the third wiring layer 4f that is a plane layer on the side opposite thereto and the second wiring layer 4e is made small.

This can reduce the impedance coupling between the power plane 8a, as shown in FIG. 11, of the first wiring layer 4d that is a plane layer on the surface of the core layer 4c and the first and second wirings 4m and 4n, and can increase the impedance coupling between the power plane 8a, as shown in FIG. 9, of the third wiring layer 4f that is a plane layer on the side opposite thereto and the first and second wirings 4m and 4n.

As a result, it becomes possible to control the characteristic impedance of the wirings with high accuracy, and to reduce the difference of the characteristic impedance between the first wiring 4m arranged just above the through hole 4r and the second wiring 4n arranged away from just above the through hole 4r.

For this reason, the improvement in the electric properties of the BGA 1 can be achieved.

Then, in attempting to reduce the variation in the characteristic impedance in the board structure shown in FIG. 6, the effect on calculation simulation will be described.

For example, in a conventional board, there is the thickness (D) of the first insulating layer 4i is equal to the thickness (C) of the second insulating layer 4j. So, if the characteristic impedance is calculated under the conditions that (D)=(C)=40 µm and each width of the first wiring 4m and the second wiring 4n is 50 µm, the characteristic impedance of the first wiring 4m (just above the through hole) is about 56.2 Ω and that of the second wiring 4n (above the power plane arranged away from the through hole 4r) is about 44.5 Ω.

This is for the reason that: when the signal is transmitted to the wirings, a feedback current flows through the plane layer opposite thereto; however, since there exist the holes formed in the course of the path of the feedback current, the inductance is increased. According to the values of the results of the above-mentioned calculation, the difference between them becomes about 12 Ω depending on patterns of the plane layer.

At this time, in view of the variations in the thickness of the insulating layer itself and in the width of the wiring from a design value, it is very difficult to control, for example, the variation in the characteristic impedance within ±15% (±7.5 Ω) relative to the characteristic impedance having a common target value of 50 Ω.

In contrast, in the package board 4 of the BGA 1 in the first embodiment, when the characteristic impedance is calculated under the conditions that, for example, the thickness (D) of the first insulating layer 4i is 50 µm and that (C) of the second insulating layer 4j is 30 µm and the respective widths of the first wiring 4m and the second wiring 4n are 40 µm, the characteristic impedance of the first wiring 4m (just above the through hole) is about 54.8 Ω and that of the second wiring 4n (above the power plane arranged away from the through hole 4r) is about 47.9 Ω.

As a result, the variation due to the wiring pattern in the plane layer is reduced to about 7 Ω, and it is possible to achieve an characteristic impedance of 50 Ω±15% even in the view of the respective variations in the thickness of the insulating layer itself and the width of the wiring.

This is because the impedance coupling of the first wiring 4m and the second wiring 4n to the power plane 8a of the third wiring layer 4f is reinforced by making the thickness of the first insulating layer 4i larger than that of the second insulating layer 4j and making the thickness of the second insulating layer 4j smaller than its original thickness. In this manner, the variation in the characteristic impedance can be reduced without changing the center value of the characteristic impedance between the wirings.

There are also means of: enlarging the width of only the signal wiring passing above the through-hole wiring; and reducing the difference in characteristic impedance between the signal wiring passing above it and the signal wiring not passing above it. However, it is quite effective to adjust the thickness of the insulating layer similarly to the first embodiment when the width of the wiring cannot be enlarged because of the limitation of the wiring pitch.

Note that, in the package board 4 in the first embodiment, in setting each thickness of the first insulating layer 4i, the second insulating layer 4j, the third insulating layer 4k and the fourth insulating layer 4l, the thickness (A) of the fourth insulating layer 4l shown in FIG. 5 is desirably larger than that (C) of the second insulating layer 4j and smaller than that (D) of the first insulating layer 4i. Furthermore, the thickness (B) of the third insulating layer 4k is desirably larger than that (C) of the second insulating layer 4j and smaller than that (D) of the first insulating layer 4i.

More specifically, if the conditions that (D)>(A)>(C) and (D)>(B)>(C) are satisfied, the thickness (C) of the second insulating layer 4j is smaller than that (A) of the fourth insulating layer 4l and that (B) of the third insulating layer 4k. Therefore, it is possible to make the characteristic impedance of the first signal wiring 8c of the second wiring layer 4e nearly equal to that of the second signal wiring 8d of the fourth wiring layer 4g, and to reduce the variation in the characteristic impedance between the first signal wiring 8c and the second signal wiring 8d.

Also, the difference between the thickness (D) of the first insulating layer 4i and that (C) of the second insulating layer 4j is made larger than that of the first signal wiring 8c of the second wiring layer 4e. More specifically, each thickness of the first signal wiring 8c and the second signal wiring 8d is, for example, about 10 µm, and the difference in thickness between the first insulating layer 4i and the second insulating layer 4j is surely controlled so as to be larger than each thickness of the first signal wiring 8c and the second signal wiring 8d.

More specifically, the difference in thickness between the first insulating layer 4i and the second insulating layer 4j is not caused by the variation error of each thickness of them but is caused by the intentional control of the first insulating layer 4i to be larger in thickness than the second insulating layer 4j.

As described above, the package board 4 according to the first embodiment is more effectively applied to, for example, a semiconductor package such as the BGA 1 that performs a high-speed operation at 500 MHz.

(Second Embodiment)

Figure 14:
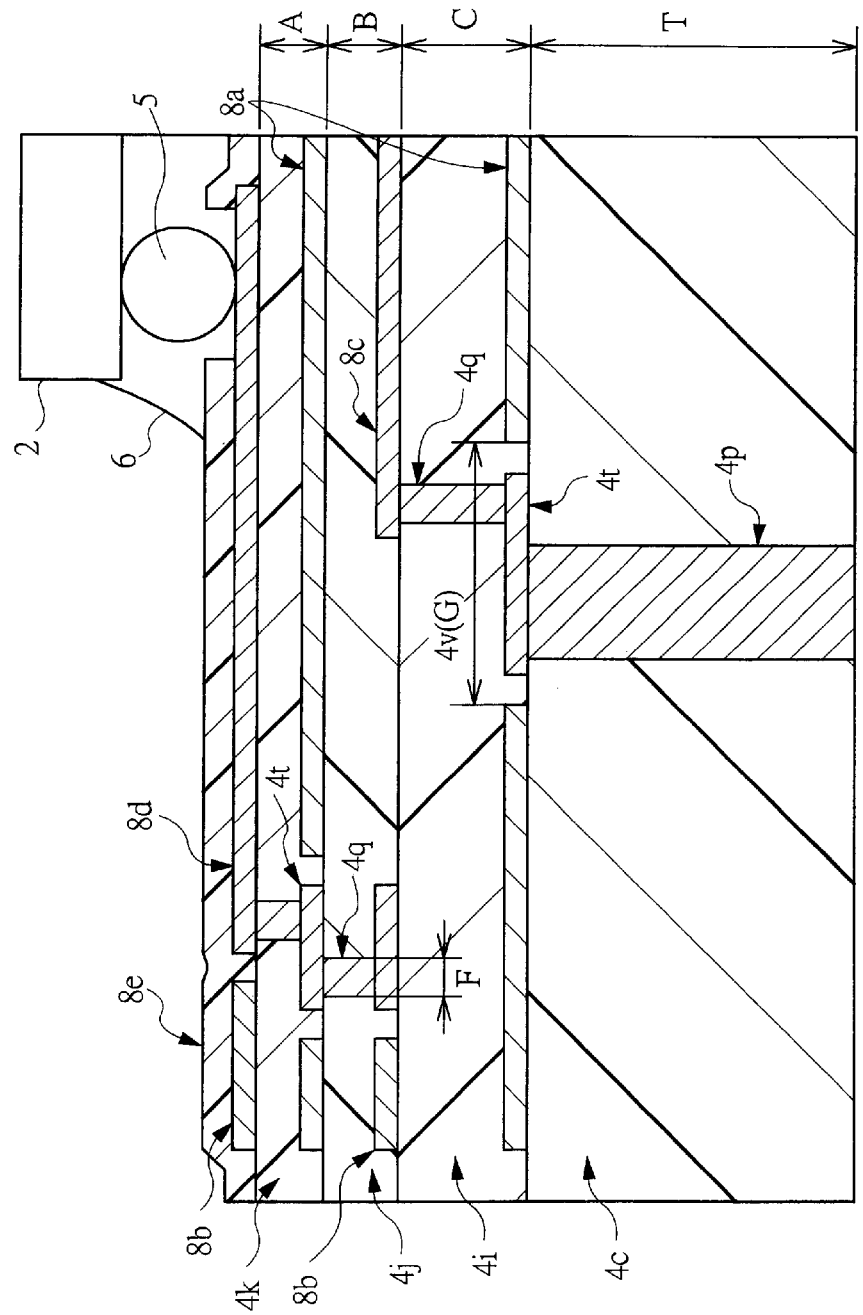
FIG. 14 is partially enlarged sectional view showing an example of a detailed structure of a multilayer circuit board in a semiconductor device (BGA) according to a second embodiment of the present invention.

FIG. 14 is a partially enlarged sectional view showing an example of a detailed structure of a multilayer circuit board in a semiconductor device (FC-BGA) according to a second embodiment of the present invention.

In a second embodiment, the case where the package board 4 of the BGA 1 has a build-up three layer wiring structure will be described.

More specifically, four insulating layers and four wiring layers are formed in the build-up layer 4z of the package board 4. First, similarly to the BGA 1 in the first embodiment, the first wiring layer 4d having the power plane 8a as shown in FIG. 11 is formed on the surface of the core layer 4c, and further the first insulating layer 4i is formed on the first wiring layer 4d. On this layer, the second wiring layer 4e having the first signal wiring 8c shown in FIG. 10, the second insulating layer 4j, the third wiring layer 4f having the power plane 8a shown in FIG. 9, the third insulating layer 4k, and the fourth wiring layer 4g having the second signal wiring 8d shown in FIG. 8 are sequentially laminated and arranged.

Additionally, the uppermost fourth wiring layer 4g is covered with an insulating film such as a resist film etc. to be the main surface 4a of the package board 4, and the semiconductor chip 2 is flip-chip bonded on the main surface 4a.

Also in the BGA 1 in the second embodiment, the gap between the first wiring layer 4d and the second wiring layer 4e is made larger than that between the second wiring layer 4e and the third wiring layer 4f, and also larger than that between the third wiring layer 4f and the fourth wiring layer 4g.

More specifically, the thickness (C) of the first insulating layer 4i is made larger than that (B) of the second insulating layer 4j, and preferably larger than that (A) of the third insulating layer 4k.

This, similarly to the first embodiment, can reduce the variation in the characteristic impedance between the wirings.

Also at this time, by making the thickness of the third insulating layer 4k equal to or smaller than that of the second insulating layer 4j, it is possible to reinforce the impedance coupling between the fourth wiring layer 4g and the third wiring layer 4f and to suppress the deviation in the center value of the characteristic impedance between the second wiring layer 4e and the fourth wiring layer 4g.

Also, similarly to the case described in the first embodiment, since the plurality of wiring escapes 4v with a large area are formed in the power plane 8a of the first wiring layer 4d, the area of the conductive portion of the power plane 8a in the third wiring layer 4f is larger than that of the power plane 8a in the first wiring layer 4d.

Furthermore, the difference between the thickness (C) of the first insulating layer 4i and that (B) of the second insulating layer 4j is made larger than that of the first signal wiring 8c in the second wiring layer 4e. More specifically, each wiring thickness of the first signal wiring 8c and the second signal wiring 8d is, for example, about 10 μm. The difference in thickness between the first insulating layer 4i and the second insulating layer 4j is intentionally controlled to be certainly larger than each wiring thickness of the first signal wiring 8c and the second signal wiring 8d.

As described above, it is possible to obtain the same advantages as those in the first embodiment even in the case of the BGA 1 employing the package board 4 shown in the second embodiment.

More specifically, similarly to the first embodiment shown in FIG. 6, even if the first wiring 4m for the signal is formed just above the through hole 4r and/or the wiring escape 4v, it is possible to reduce the difference of the characteristic impedance between the first wiring 4m and the second wiring 4n not arranged above the through hole 4r and arranged away from the wiring escape 4v.

Furthermore, since the package board 4 of the second embodiment has the three insulating layers, the cost of the package board 4 can be reduced in comparison to the package board 4 in the first embodiment, whereby the cost of the BGA 1 can be also reduced.

In the foregoing, the invention made by the present inventors has been concretely described based on the embodiments. However, needless to say, the present invention is not limited to the foregoing embodiments and can be variously modified and changed without departing from the gist thereof.

For example, the case where the BGA 1 is used as a semiconductor device has been described in the first and second embodiments. However, the above-mentioned semiconductor device may employ, for example, a PGA (Pin Grid Array), a LGA (Land Grid Array) or the like even if the semiconductor package utilizes the package board 4, which is a multilayer circuit board formed by the build-up process.

The advantages achieved by the typical ones of the inventions disclosed in this application will be briefly described as follows.

In the multilayer circuit board, the first wiring layer with the power plane is formed on the surface of the base member and the third wiring layer with the power plane is formed thereon via the insulating layer. Furthermore, the second wiring layer with the signal wiring is formed between the first and third wiring layers. In forming these layers, the gap between the first and second wiring layers is made larger than that between the second and third wiring layers, and the area of the power plane in the third wiring layer is made larger than that in the first wiring layer, thereby allowing for reducing the variation in the characteristic impedance of the wirings.

What is claimed is:

1. A semiconductor device comprising:
   a multilayer circuit board having an insulating base member, a first wiring layer arranged on a surface of said base member and provided with a power plane for supplying electric power, a third wiring layer arranged on said first wiring layer via an insulating layer and provided with a power plane for supplying electric power, and a second wiring layer arranged between said first and third wiring layers and provided with a first signal wiring for transmitting a signal; and
   a semiconductor chip arranged on a main surface of said multilayer circuit board,
   wherein the gap between said first and second wiring layers is larger than that between said second and third wiring layers, and an area of said power plane of said third wiring layer is larger than that of said power plane of said first wiring layer.

2. A semiconductor device comprising:
   a multilayer circuit board having an insulating base member, a first wiring layer arranged on a surface of said base member and provided with a power plane for supplying electric power, a third wiring layer arranged on said first wiring layer via an insulating layer and supplying electric power, a fifth wiring layer arranged on said third wiring layer via an insulating layer in a direction further away from said base member and supplying electric power, a second wiring layer arranged between said first and third wiring layers and provided with a first signal wiring for transmitting a signal, and a fourth wiring layer arranged between said third and fifth wiring layers and provided with a second signal wiring for transmitting a signal; and
   a semiconductor chip arranged on a main surface of said multilayer circuit board,
   wherein the gap between said fifth and fourth wiring layers is larger than that between said second and third wiring layers and is smaller than that between said first and second wiring layers, and the gap between said third and fourth wiring layers is larger than that between said second and third wiring layers and is smaller than that between said first and second wiring layers.

3. A semiconductor device comprising:
   a multilayer circuit board having an insulating base member provided with a plurality of first through-hole wirings passing between a front and rear surfaces thereof, a first wiring layer arranged on a surface of said base member and provided with a power plane for supplying electric power, a third wiring layer arranged on said first wiring layer via an insulating layer and provided with a power plane for supplying electric power, a second wiring layer arranged between said first and third wiring layers and provided with a first signal wiring for transmitting a signal, and a fourth wiring layer arranged on said third wiring layer via an insulating layer in a direction further away from said base member and provided with a second signal wiring for transmitting a signal; and
   a semiconductor chip arranged on a main surface of said multilayer circuit board,
   wherein the gap between said first and second wiring layers is larger than that between said second and third wiring layers, and the wiring diameter of a second through-hole wiring for connecting said first and second signal wirings is smaller than that of said first through-hole wiring.

4. The semiconductor device according to claim 1, wherein the difference between the gap between said first and second wiring layers and that between said second and third wiring layers is larger than the thickness of said signal wiring of said second wiring layer.

5. The semiconductor device according to claim 2, wherein a plurality of first through-hole wirings passing between a front and rear surfaces of said base member are formed, the diameter of a wiring escape of said first through-hole wiring of said first wiring layer is larger than any of the gaps between said fifth and fourth wiring layers, between said fourth and third wiring layers, between said third and second wiring layers, and between said second and first wiring layers.

6. The semiconductor device according to claim 3, wherein a wiring escape of said first through-hole wiring of the first wiring layer is larger in size than one of said second through-hole wiring of said third wiring layer.

7. A semiconductor device comprising:

a multilayer circuit board having an insulating base member, a first wiring layer arranged on a surface of said base member and provided with a power plane for supplying electric power, a third wiring layer arranged on said first wiring layer via an insulating layer and provided with a power plane for supplying electric power, a second wiring layer arranged between said first and third wiring layers and provided with a first signal wiring for transmitting a signal, and a fourth wiring layer arranged on said third wiring layer via an insulating layer in a direction further away from said base member and transmitting a signal; and a semiconductor chip arranged on a main surface of said multilayer circuit board, wherein the gap between said first and second wiring layers is larger than that between said second and third wiring layers.

8. A semiconductor device comprising:

a multilayer circuit board having an insulating base member, a first wiring layer arranged on a surface of said base member and provided with a power plane for supplying electric power, a third wiring layer arranged on said first wiring layer via an insulating layer and provided with a power plane for supplying electric power, a second wiring layer arranged between said first and third wiring layers and provided with a first signal wiring for transmitting a signal, and a fourth wiring layer arranged on said third wiring layer via an insulating layer in a direction further away from said base member; and a semiconductor chip arranged on a main surface of said multilayer circuit board, wherein the gap between said first and second wiring layers is larger than that between said second and third wiring layers and is larger than that between said third and fourth wiring layers.

9. The semiconductor device according to claim 7, wherein the area of said power plane of said third wiring layer is larger than that of said power plane of said first wiring layer.

10. The semiconductor device according to claim 7, wherein the difference between the gap between said fourth and third wiring layers and that between said third and second wiring layers is smaller than the thickness of said first signal wiring of said second wiring layer.

11. A semiconductor device comprising:

a multilayer circuit board having a second wiring layer provided with a first signal wiring for transmitting a signal, a first wiring layer arranged via an insulating layer on one of a front and rear surfaces of said second wiring layer and provided with a power plane for supplying electric power, and a third wiring layer arranged via an insulating layer on the other of the front and rear surfaces of said second wiring layer and provided with a power plane for supplying electric power; and a semiconductor chip arranged on a main surface of said multilayer circuit board, wherein the gap between said second wiring layer and one of said first and third wiring layers, which has a smaller power plane in area than the other, is larger than that between said second layer and the other, which has a larger power plane in area.

* * * * *